United States Patent
Park et al.

(10) Patent No.: US 6,565,380 B1
(45) Date of Patent: May 20, 2003

(54) BATTERY CONTACT ARRANGEMENT

(75) Inventors: Ilwhan Park, Pleasanton, CA (US); Jae H. Shim, San Jose, CA (US)

(73) Assignee: Mobigence, Inc., San Jose, CA (US)

( * ) Notice: Subject to any disclaimer, the term of this patent is extended or adjusted under 35 U.S.C. 154(b) by 0 days.

(21) Appl. No.: 09/795,827

(22) Filed: Feb. 27, 2001

(51) Int. Cl.[7] ................................................ H01R 3/00
(52) U.S. Cl. ...................... 439/500; 439/76.1; 439/74
(58) Field of Search ........................ 439/74, 76.1, 500

(56) References Cited

U.S. PATENT DOCUMENTS

| | | | |
|---|---|---|---|
| 4,829,666 A | * 5/1989 | Haghiri-Tehrani et al. | 174/52.4 |
| 5,132,877 A | * 7/1992 | Branan et al. | 361/736 |
| 5,910,025 A | * 6/1999 | Mendolia | 439/76.1 |
| 5,933,330 A | * 8/1999 | Beutler et al. | 320/114 |
| 6,224,388 B1 | * 5/2001 | Ahr et al. | 439/55 |
| 6,290,533 B1 | * 9/2001 | Major | 362/253 |
| 6,361,328 B1 | * 3/2002 | Gosselin | 439/66 |

OTHER PUBLICATIONS

The American Heritage dictionary of the English Language, Third Edition copyright 1992 by Houghton Mifflin Company. Electronic version liecensed fro INSO Corporation.*

* cited by examiner

Primary Examiner—Tho D. Ta
Assistant Examiner—James R. Harvey
(74) Attorney, Agent, or Firm—John F. Schipper (57) ABSTRACT

A system including a hand held electronic device (radiotelephone, etc), hand held device housing and a battery or other power source for the hand held device. The hand held device includes one or more circuit boards within the device housing, and at least one circuit board has an aperture therein into which a PIN connection device is fitted to connect the battery to one or more circuit boards. The battery may be located outside or inside the hand held device housing. The overall thickness of the hand held device plus battery is reduced by and estimated 2–8 mm.

11 Claims, 8 Drawing Sheets

BATTERY CONTACT ARRANGEMENT

FIELD OF THE INVENTION

This invention relates to battery assembly, including electrical contact arrangement for providing electrical power from a battery to a circuit board for a portable hand held computing device.

BACKGROUND OF THE INVENTION

Portable hand held computing devices, such as radiotelephones, have become more compact. One of the contributing factors in providing a more compact hand held device is an advance in rechargeable battery technology, such as a lithium ion or lithium polymer battery, for transferring electrical power from the battery to a circuit board. However, a continuing objective for hand held devices is to further reduce the device form factor by maximizing efficient use of available space within the device.

In a conventional approach for rechargeable battery attachment in a hand held device, a battery pack (including battery, protection circuitry and contact terminals) is externally attached to the hand held device housing, with a battery contact pin device exposed outside the housing. The pin device includes an electrical connector on the circuit board that is mechanically biased by a spring against a battery terminal. In this approach, the spring loaded pin device and the external mounting of the battery pack become limiting factors in further reduction of the thickness of the hand held device, unless other functional and structural features of the pin device are made thinner and/or more tightly spaced on a circuit board for the hand held device.

Figure 1:
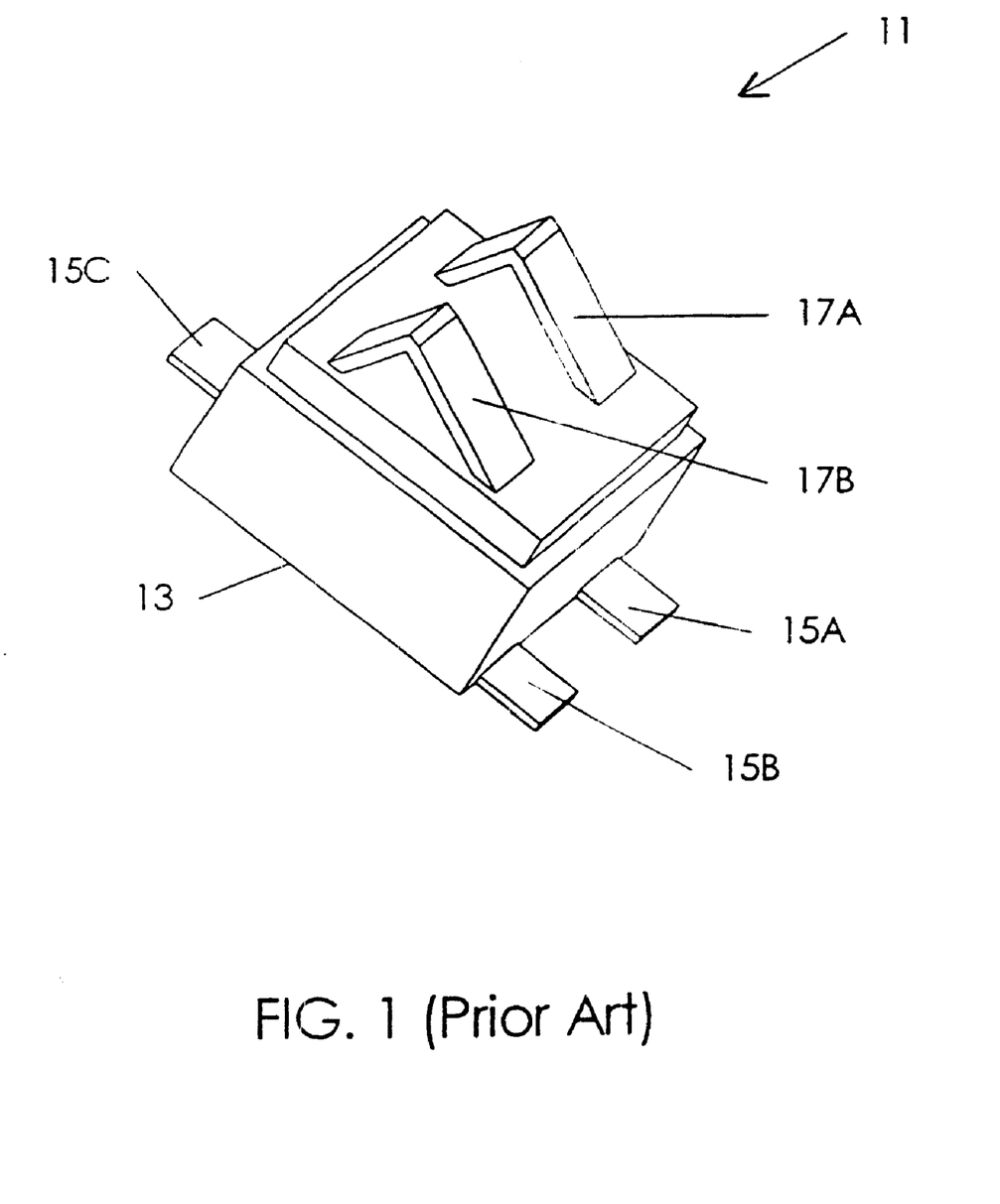
FIG. 1 schematically illustrates a conventional PIN connector device.

A portable radiotelephone having a detachable battery (1702 in FIG. 17), externally mounted on a clam shell cover, is disclosed in U.S. Pat. No. 5,933,330, issued to Beutler et al. The overall thickness of the housing, as shown in FIG. 1, is about 26 mm and includes a battery height of about 7 mm. Use of conventional approaches such as these provides hand held devices with thicknesses of about 23–30 mm.

In an unusual approach implemented by Qualcomm, a battery is internally positioned, within the housing, a pin device is attached to the battery, and the circuit board provides an electrical terminal. Although this approach may reduce overall hand held device thickness to below 23 mm, this approach is also limited by pin device thickness, which is usually greater than battery thickness.

What is needed is a battery/hand held device configuration and associated device housing that permits use of smaller overall hand held device thickness, wherein the connections to the power source are reconfigured to provide an improved architecture and improved performance that allow easier device gripping and less device bulk.

SUMMARY OF THE INVENTION

These needs are met by the invention, which provides a reconfiguration of placement of the battery, within the hand held device housing. A spring-loaded pin device for battery contact is mounted on another side of a circuit board, the battery is mounted within, not external to, the device housing, and the spring-loaded pins are exposed through apertures in the circuit board for contact with terminals on a battery pack. Battery placement within the device housing allows additional reduction in thickness of the hand held device, and allows a reduction in cost and a further reduction in hand held device thickness.

DESCRIPTION OF BEST MODES OF THE INVENTION

FIG. 1 illustrates a conventional battery PIN connector device 11, including a PIN connector device housing 13, two soldering feet, 15A and 15B, for electrical connection, a (dummy) soldering foot 15C for mechanical stability, and two spring-loaded battery contacts, 17A and 17B. The battery contacts, 17A and 17B, protrude from the PIN device housing and make contact with terminals on the battery. Use of this PIN connection device in a conventional manner provides a combined device housing plus battery thickness of 23–30 mm. Different PIN connector shapes, such as angular (shown in FIG. 1), curvilinear and needle-shaped can be used here.

Figure 2A:
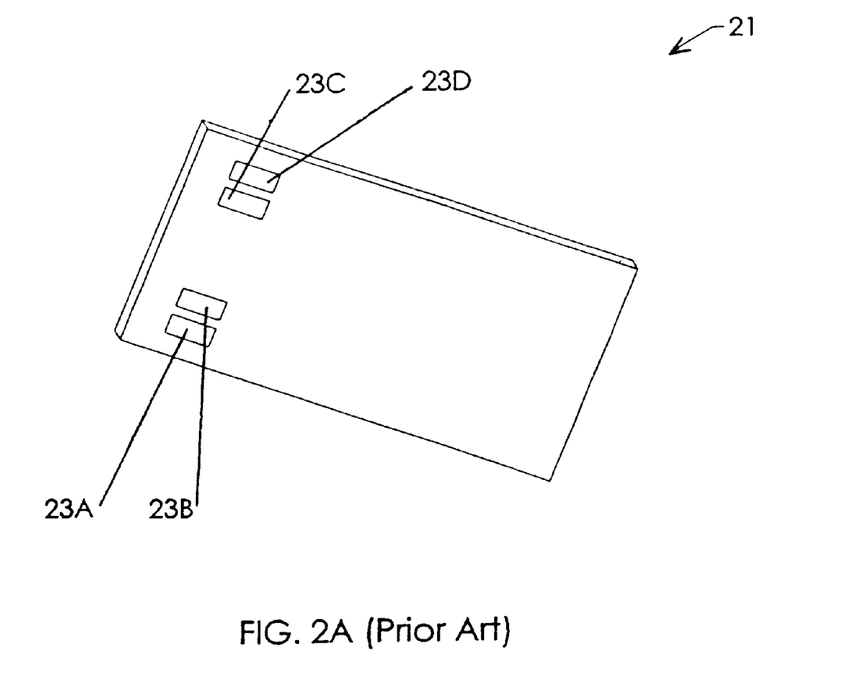
FIGS. 2A and 2B schematically illustrate a conventional battery pack.
Figure 2B:
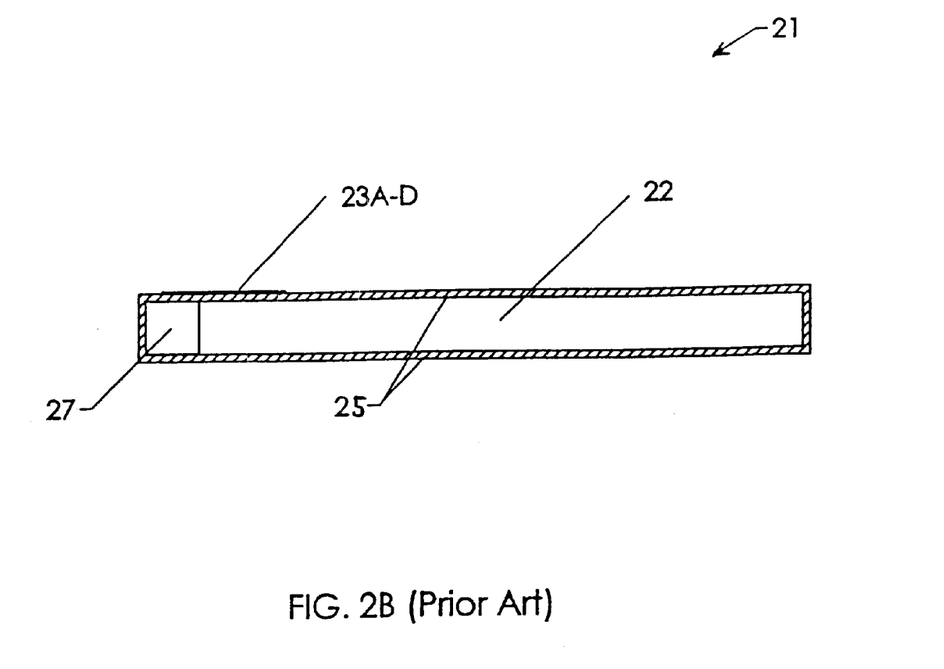

FIGS. 2A and 2B are a perspective view and a cross-sectional view of a conventional battery pack 21, including two to four contact terminals, 23A, 23B, 23C and 23D, for contact with a battery connection device such as 11 shown in FIG. 1. Two or more battery contacts, such as 17A and 17B in FIG. 1, make contact with two or more of the battery pack terminals, such as 23A and 23B, and another pair of battery contacts (optional, not shown) make contact with two more battery pack terminals, 23C and 23D. The battery pack housing has a thickness in a range 1–1.2 mm on each surface. The battery pack 21 shown in FIG. 2B includes protective circuitry 27.

Figure 3A:
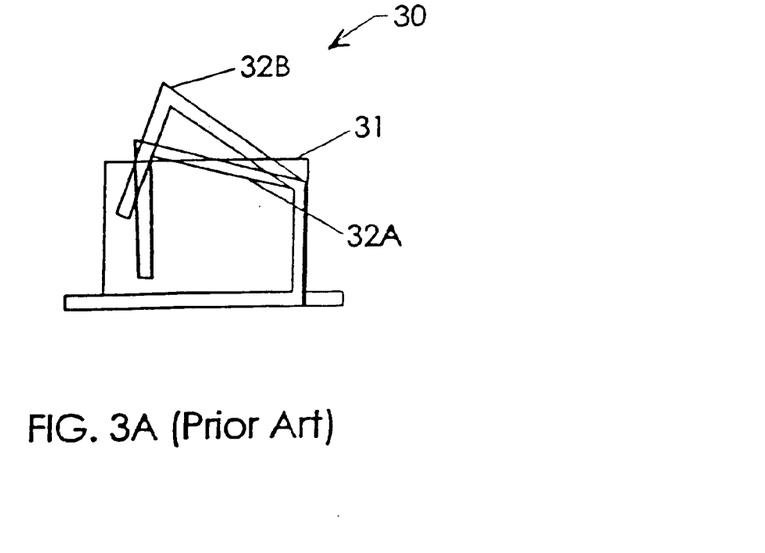
FIG. 3A is a schematic view of a conventional spring PIN battery connector device.

FIG. 3A illustrates use of a battery PIN connection device 30. In a first position, a spring-loaded connector 32(A) is partly or wholly received within the PIN connection device housing 31 and makes contact with an electrical terminal on a battery pack (not shown in FIG. 3A). In a second (exposed) position, the connector 32(B) is partly or wholly outside the PIN device housing 31, and electrical contact with the battery pack is interrupted.

Figure 3B:
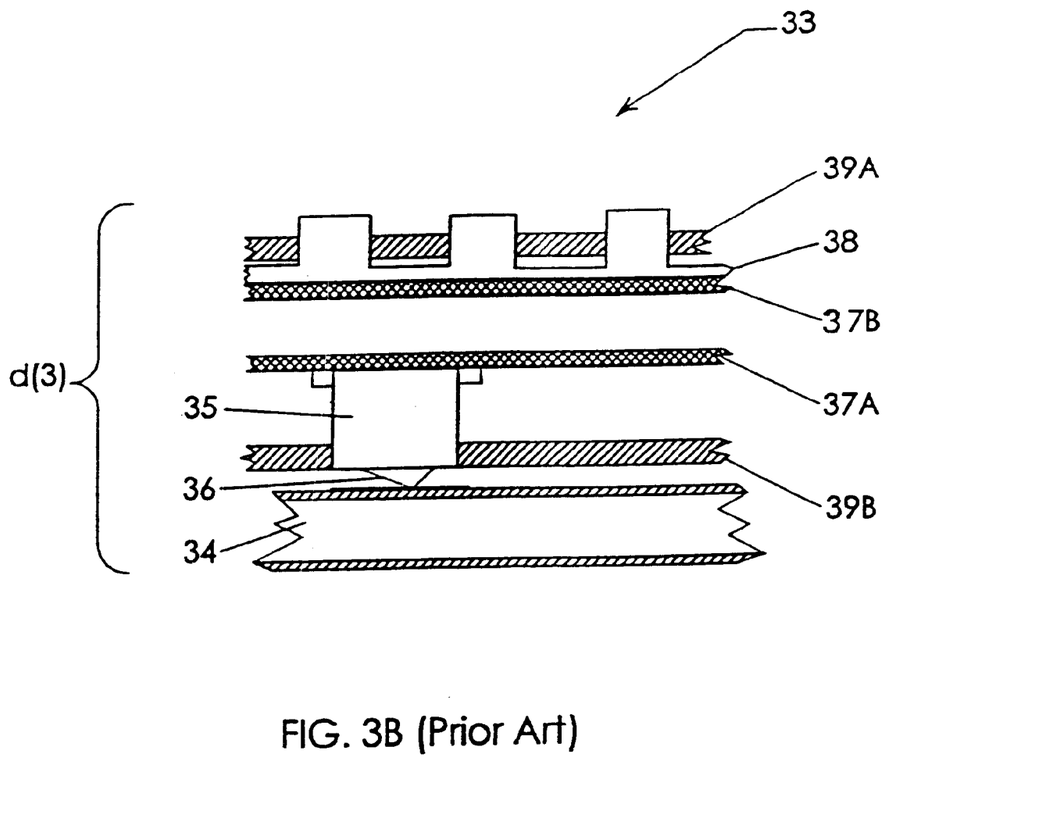
FIG. 3B is a schematic side view illustrating conventional placement of battery pack, two circuit boards, a keypad/interface and hand held device housing.

FIG. 3B is a schematic side view of a hand held device 33 illustrating conventional placement of battery pack 34, a PIN connection device housing 35, a PIN connector 36, two circuit boards, 37A and 37B, a keypad and keypad interface 38 and a housing, 39A and 39B, for the hand held device. The battery pack 34 is attached externally to the hand held device housing, 39A or 39B, and is electrically connected through the PIN connector 36, to one or more circuit boards, 37A and 37B. The PIN connection device includes two or more spring-loaded electrical connectors (17A and 17B in FIG. 1; 36 in FIG. 3B) that make contact with corresponding electrical terminals (e.g., 23A and 23B in FIG. 2) in the battery pack 34. One circuit board 37A serves as a first circuit board and a second circuit board 37B serves as a special purpose circuit board, including a keypad and keypad interface 38. The PIN connection housing 35 acts as a spacer between one side of the hand held device housing, 39A or 39B, and the nearest circuit board 37A, with a built-in spacer depth of about 11 mm or more. With the conventional configuration shown in FIG. 3B, the overall thickness d(3) of the hand held device housing plus attached battery is usually 23–30 mm or more. The thickness d(3) includes thicknesses of front (second surface) and rear (first surface) hand held device housing, 39A and 39B, of a second (keypad) circuit board 37B, of a first (main) circuit board 37A, of a required minimum spacing between the first and second circuit boards, of the PIN device housing 35, and of a battery pack 34. Reduction of hand held device thickness is constrained by thickness of PIN connector mechanisms present within such devices.

Figure 4:
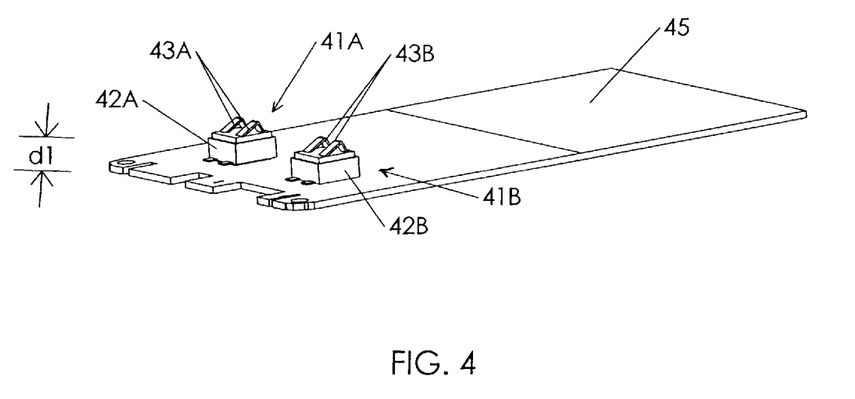
FIG. 4 is a side view of a PIN connection device mounted on a circuit board according to the invention.

FIG. 4 is a side view illustrating placement of two PIN connection devices, 41A and 41B, on a circuit board 45 according to one embodiment of the invention. PIN connection device housings, 42A and 42B, are mounted directly on the circuit board 45, with the PIN connectors 43A and 43B exposed and oriented away from the circuit board. Each PIN connection device housing, 42A and 42B, has a height d1 with a specified minimum value (e.g., 4–5 mm) or more.

Figure 5:
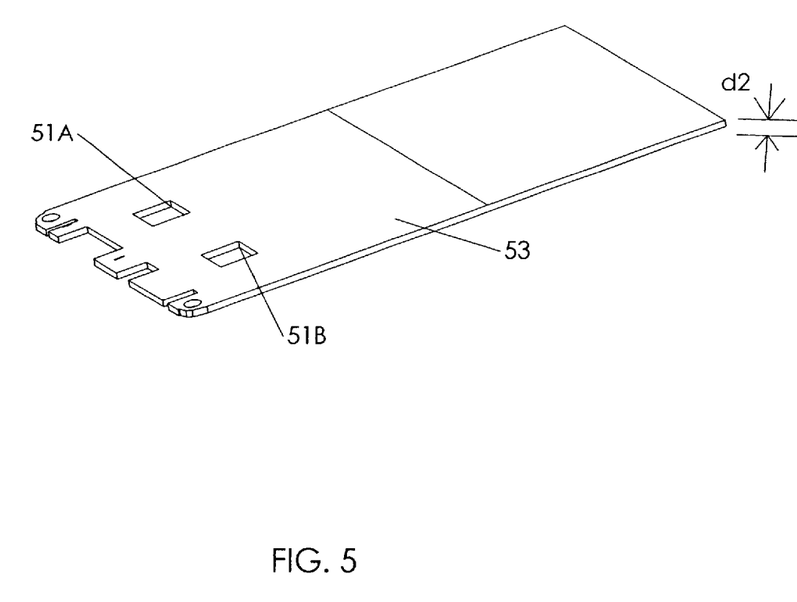
FIG. 5 is a perspective view illustrating apertures or vias provided in a circuit board to accommodate a PIN connector device housing.

FIG. 5 is a perspective view illustrating provision of two apertures or vias, 51A and 51B, in a circuit board 53 to accept corresponding PIN connector device housings (42A and 42B in FIG. 4). The thickness d2 of the circuit board 53 will be much less than the height d1 of the PIN device housing, 42A or 42B, so that the PIN device housing height d1, rather than the circuit board thickness d2, is a limiting factor in reduction of overall thickness of the hand held device plus battery. The vertical location of the solder feet (15A, 15B and 15C in FIG. 1), which serve as a mechanical "seat" and/or as an electrical terminal on the circuit board 53, often dictates the vertical placement of a PIN connection device (41A and 41B in FIG. 4) relative to the circuit board.

Figure 6A:
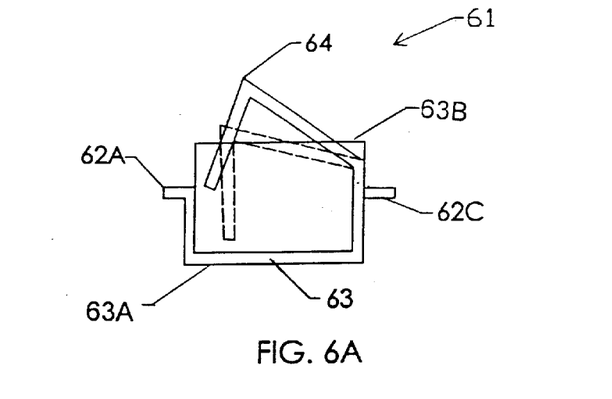
FIGS. 6A and 7A illustrate alternate modifications of solder foot location to accommodate a modified PIN connector device.

By vertically translating the solder feet, 62A and 62C, of a PIN connection device 61 in FIG. 6A from the bottom of this device to another position, the PIN connection device housing 63 may be moved vertically, relative to a corresponding circuit board, by a more-or-less arbitrary distance. This approach allows the effective height of the PIN device housing (d1 in FIG. 4) to be reduced so that, in some instances, the effective height (d3 in FIGS. 6B and 6C) is approximately equal to the circuit board thickness d2 (shown in FIG. 5). Operation of the spring-loaded PIN connector 64 of the PIN connection device 61 is not affected by this movement.

Figure 6B:
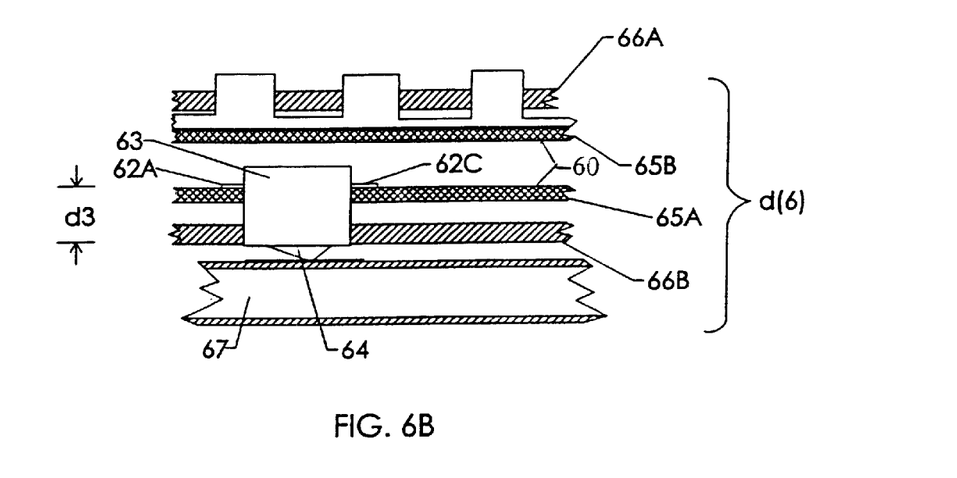
FIGS. 6B, 6C, 7B and 7C illustrate structural arrangements, including a modified PIN connection device, corresponding to FIGS. 6A and 7A.
Figure 6C:
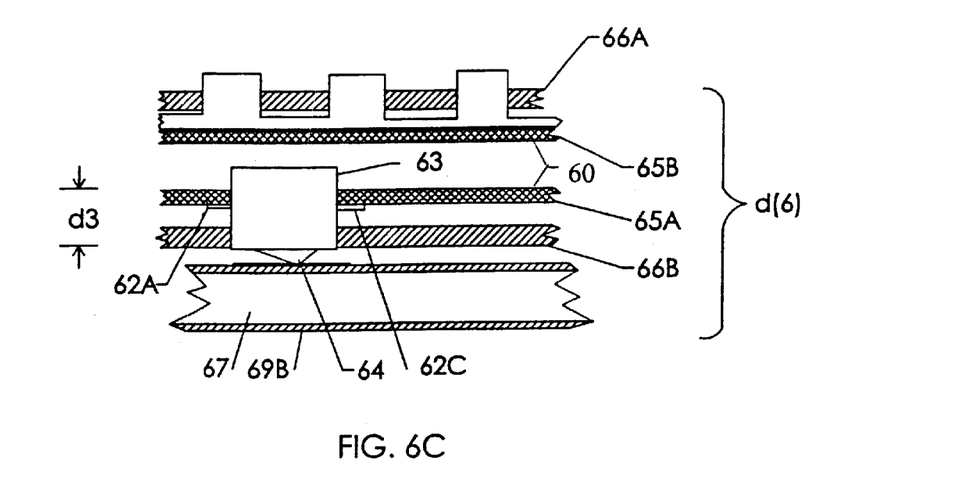

FIGS. 6B and 6C are cross-sectional views of the "layers" of a hand held device plus battery according to an embodiment of the invention, incorporating translation of the solder feet, 62A and 62C, shown in FIG. 6A and with the solder feet positioned against an upper surface (FIG. 6B) and against a lower surface (FIG. 6C) of a circuit board 65A. The solder feet, 62A and 62C, are translated vertically so that the distance d3 between a selected (top) surface of the circuit board 65A and a selected (bottom) surface of the PIN device housing 63 is reduced toward a minimum distance between these two surfaces. The circuit board 65A and the hand held device housing, 66A and 66B, must be spaced apart by some minimum distance, using spacers, to avoid short circuits and other electrical interference consequences. Using the configuration illustrated in FIGS. 6A and 6B, or in FIGS. 6A and 6C, the overall thickness d(6) of the hand held device plus battery pack 67, measured from the hand held device housing second surface 66A to a rear housing 69B of the battery pack 67, is reduced by an estimated 2–3 mm, relative to the thickness (23–30 mm) of a conventional hand held device plus battery system. A second circuit board 65B is optionally included.

Figure 7A:
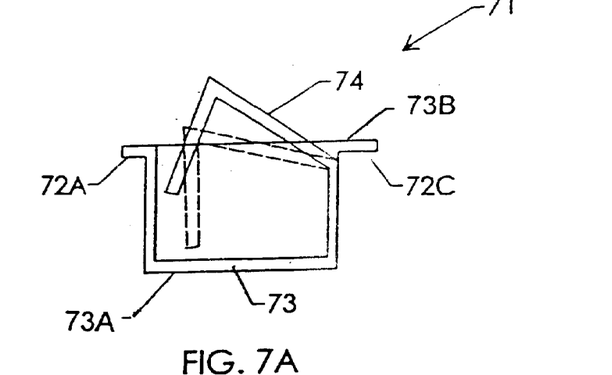

By vertically translating the solder feet, 72A and 72C, of a PIN connection device 71 in FIG. 7A from the bottom of this device to approximately the top of this device, the PIN connection device housing 73 may be moved vertically, relative to a corresponding circuit board, by a maximum distance. This approach allows the effective height d4 of the PIN device housing 73 to be reduced to approximately its minimum value (d2 in FIG. 5).

Figure 7B:
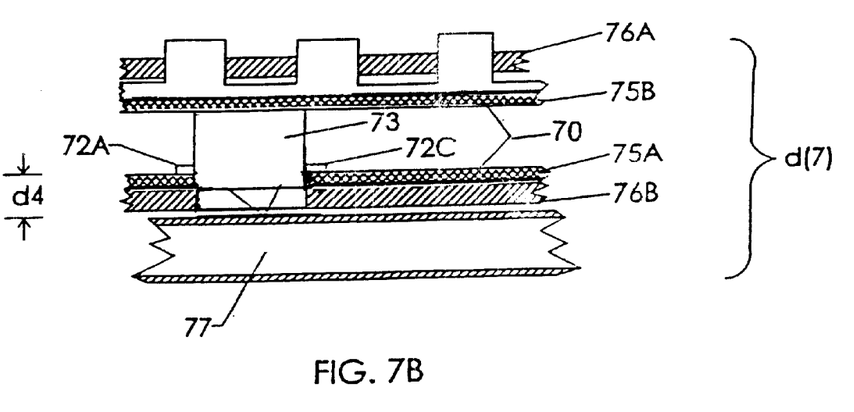
Figure 7C:
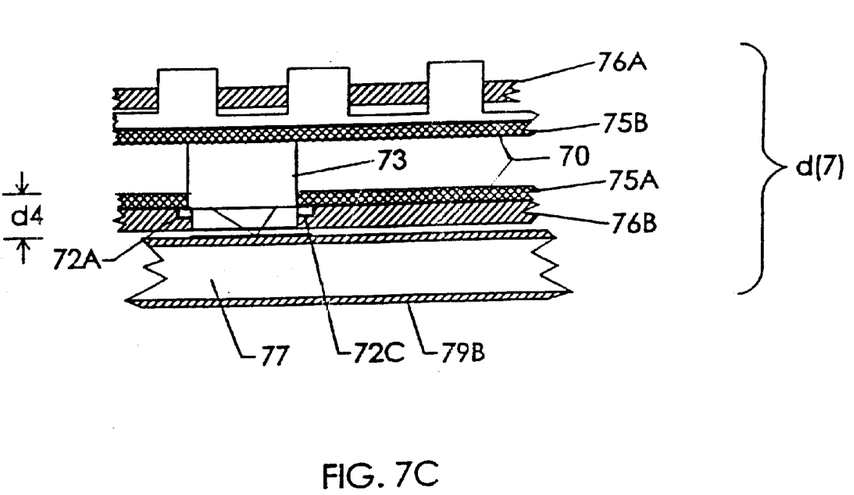

FIGS. 7B and 7C are cross-sectional views of the "layers" of a hand held device plus battery according to an embodiment of the invention incorporating the solder feet translation shown in FIG. 7A, with the solder feet, 72A and 72C, positioned against an upper surface (FIG. 7B) and positioned against a lower surface (FIG. 7C) of a circuit board 75A. Alternatively, one of the two solder feet can be positioned against an upper surface of the circuit board 75A and another of the two solder feet can be positioned against a lower surface of the circuit board 75A.

With the arrangement shown in FIG. 7B or 7C, the circuit board 75A and one surface 76B of the hand held device housing become substantially contiguous, and the overall thickness d(7) of the hand held device plus battery, measured from the hand held device housing second surface 76A to a rear housing 79B of the battery pack 77, is reduced by an estimated 3–5 mm, relative to the thickness (23–30 mm) of a conventional hand held device plus battery system. A second circuit board 75B is optionally included. measured from the hand held device front housing 76A to a rear housing 79B of the battery pack 77, is reduced by an estimated 3–5 mm, relative to the thickness (23–30 mm) of a conventional hand held device plus battery system. A second circuit board 75B is optionally included.

Figure 8:
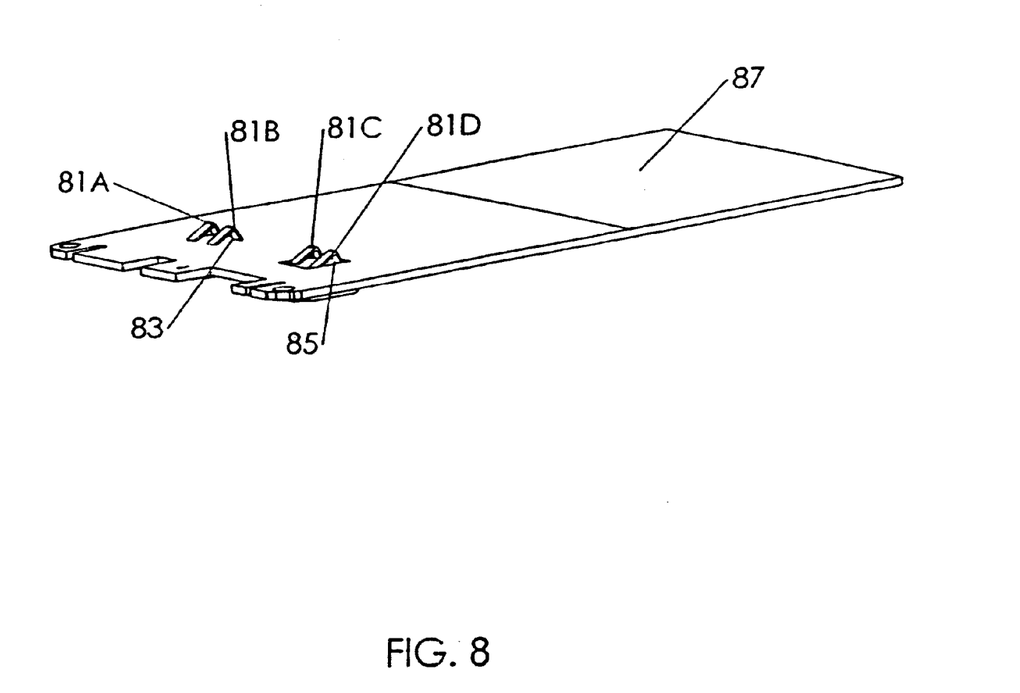
FIG. 8 is a perspective view of PIN connection device placement relative to a circuit board, consistent with FIGS. 6A/6B and FIGS. 7A/7B.

FIG. 8 is a perspective view illustrating positioning of PIN connectors, 81A, 81B, 81C and 81D, through apertures or vias, 83 and 85, in a circuit board 87, according to an embodiment of the invention. In this embodiment, the corresponding PIN connection device (not fully shown in FIG. 8) is mounted on the "bottom" of the circuit board 87, preferably using the solder feet (not shown in FIG. 8) for such mounting. FIG. 8 is consistent with the embodiments shown in FIGS. 6A/6B/6C and in FIGS. 7A/7B/7C.

Figure 9:
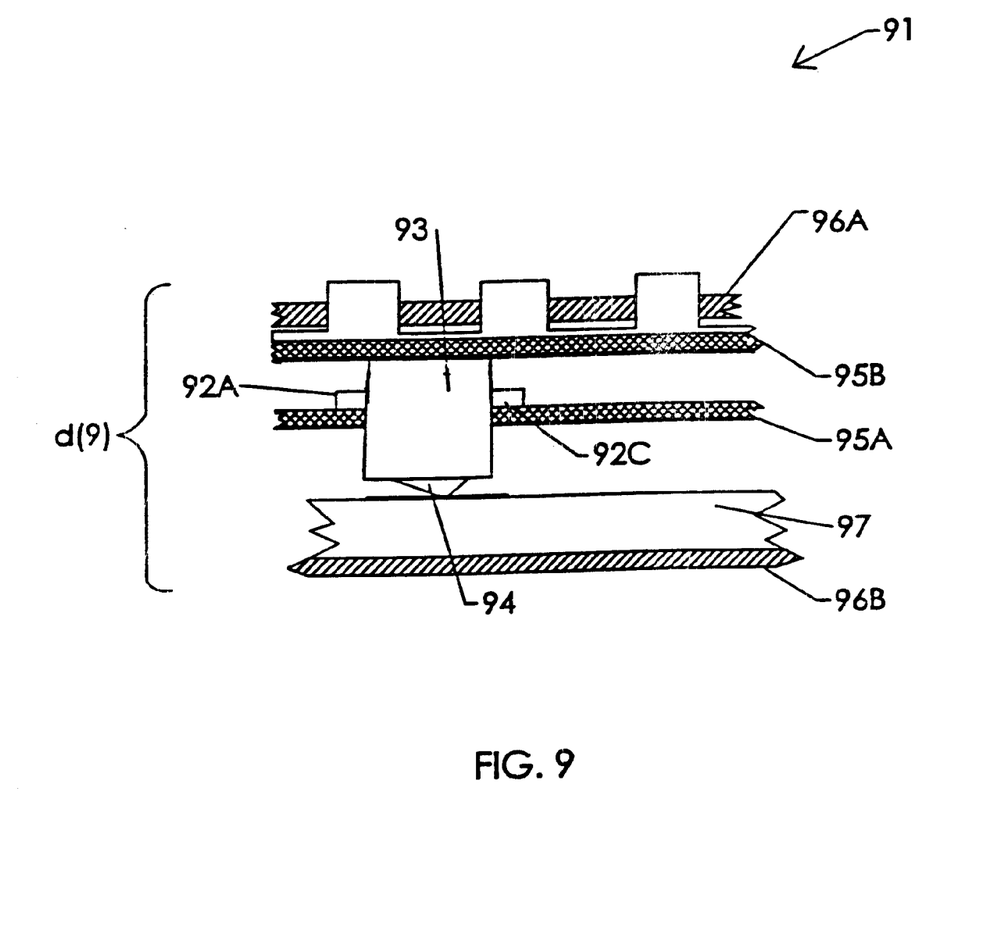
FIG. 9 illustrates a further reduction of device thickness available with internal battery placement.

FIG. 9 is a cross-sectional view of the "layers" of the hand held device 91 plus battery 97, with the battery being located internally, within or between the hand held device housing second and first surfaces, 96A and 96B. The PIN connection device housing 93 is mounted on a first circuit board 95A, using solder feet, 92A and 92C. The PIN device housing 93 extends from a second circuit board 95B (or from the hand held device housing second surface 96A, if the second circuit board is not present) through an aperture in a first circuit board 95A to a location close to the battery 97, where PIN connectors 94 make electrical contact with the battery. The reduction in overall thickness d(9) associated with this embodiment of the hand held device 91 and (internal)

battery 97 lies in a range of 3–8 mm, and more preferably in a range of 6–8 mm. Use of an internal battery offers the possibility of deleting the top surface battery housing, the bottom surface battery housing, or both, with a further saving in hand held device thickness.

The estimated ranges of thickness for hand held device plus battery for the configurations shown in FIGS. 6A/6B/6C, 7A/7B/7C and 9 are as follows.

FIGS. 6A/6B/6C d=20–21 mm
FIGS. 7A/7B/7C d=18–20 mm
FIG. 9 d=15–17 mm or 15–20 mm.

The minimum thickness d for each of these configurations is substantially lower than the estimated minimum thickness of about 23 mm for conventional battery plus hand held device systems.

What is claimed is:

1. A system of hand held device and battery, the system comprising:

a battery;

a hand held device including a hand held device housing with a device housing first surface adjacent to the battery and a device housing second surface that is spaced apart from the battery and from the device housing first surface, the hand held device having a circuit board, located within the hand held device housing, where the circuit board and the device housing first surface have a first aperture and a second aperture, respectively, that are adjacent to and face each other and the battery is located adjacent to the device housing first surface; and a PIN connector housing, located within the hand held device housing and having a connector housing surface that is spaced apart by a selected distance from the device housing second surface and containing at least two PIN connectors that each extend through the first aperture and through the second aperture to connect the battery to the circuit board, whereby an overall thickness of the system lies in a range 15–21 mm.

2. A system of hand held device and battery, the system comprising:

a battery;

a hand held device, including a hand held device housing having a device housing first surface adjacent to the battery, and having a device housing second surface that is spaced apart from the battery and from the device housing first surface, the hand held device having a first circuit board, located within the hand held device housing, where the first circuit board and the device housing first surface have a first aperture and a second aperture, respectively, therein and the first and second apertures are adjacent to and face each other and the battery is located adjacent to the device housing first surface;

a PIN connector housing, located within the hand held device housing and containing at least two PIN connectors that each extend through the first aperture and through the second aperture to connect the battery to the first circuit board; and a second circuit board, located within the hand held device housing and connected to said battery, where said first circuit board is located between said device housing first surface and the second circuit board and where the PIN connector housing has a first PIN connector housing surface that is located adjacent to, and is spaced apart by a first selected distance from, the second circuit board, whereby an overall thickness of the system lies in a range 18–21 mm.

3. A system of hand held device and battery, the system comprising:

a battery;

a hand held device, including a hand held device housing having a device housing first surface adjacent to the battery, and having a device housing second surface that is spaced apart from the battery and from the device housing first surface, the hand held device having a first circuit board, located within the hand held device housing, where the first circuit board and the device housing first surface have a first aperture and a second aperture, respectively, therein and the first and second apertures are adjacent to and face each other and the battery is located adjacent to the device housing first surface;

a PIN connector housing, located within the hand held device housing and containing at least two PIN connectors that each extend through the first aperture and through the second aperture to connect the battery to the first circuit board; and a second circuit board, located within the hand held device housing and connected to said battery, where said first circuit board is located between said device housing first surface and the second circuit board and where the PIN connector housing has a PIN connector housing surface that is located substantially contiguous to the second circuit board, whereby an overall thickness of the system lies in a range 15–20 mm.

4. The system of claim 2, wherein said hand held device includes a radiotelephone.

5. The system of claim 3, wherein said hand held device includes a radiotelephone.

6. The system of claim 2, wherein said PIN connector housing has at least two solder feet, projecting from said PIN connector housing and being positioned contiguous to said first circuit board, where said PIN connector housing is spaced apart from said second circuit board by spacing at least one of the at least two solder feet apart from said PIN connector housing first surface by a second selected distance and spacing the at least one of the at least two solder feet apart from an opposed PIN connector housing second surface by a third selected distance.

7. The system of claim 2, wherein said battery is located outside said hand held device housing.

8. The system of claim 2, wherein said battery is located within said hand held device housing.

9. The system of claim 3, wherein said PIN connector housing has at least two solder feet, projecting from said PIN connector housing and being positioned contiguous to said first circuit board, where said PIN connector housing is spaced apart from said second circuit board by spacing at least one of the at least two solder feet apart from said PIN connector housing first surface by a second selected distance and spacing the at least one of the at least two solder feet apart from an opposed PIN connector housing second surface by a third selected distance.

10. The system of claim 3, wherein said battery is located outside said hand held device housing.

11. The system of claim 3, wherein said battery is located within said hand held device housing.

* * * * *